United States Patent
Jagannathan et al.

(10) Patent No.: US 9,589,845 B1
(45) Date of Patent: Mar. 7, 2017

(54) FIN CUT ENABLING SINGLE DIFFUSION BREAKS

(71) Applicant: International Business Machines Corporation, Armonk, NY (US)

(72) Inventors: Hemanth Jagannathan, Niskayuna, NY (US); Sivananda K. Kanakasabapathy, Niskayuna, NY (US); Vamsi K. Paruchuri, Clifton Park, NY (US); Alexander Reznicek, Troy, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/161,868

(22) Filed: May 23, 2016

(51) Int. Cl.
| | |
|---|---|
| H01L 21/8234 | (2006.01) |
| H01L 29/40 | (2006.01) |
| H01L 29/78 | (2006.01) |
| H01L 21/266 | (2006.01) |
| H01L 21/265 | (2006.01) |
| H01L 21/3065 | (2006.01) |

(52) U.S. Cl.
CPC .... *H01L 21/823431* (2013.01); *H01L 21/266* (2013.01); *H01L 21/26513* (2013.01); *H01L 21/3065* (2013.01); *H01L 29/401* (2013.01); *H01L 29/7851* (2013.01)

(58) Field of Classification Search
CPC .................................................. H01L 21/8234
USPC ........................................................ 438/433
See application file for complete search history.

(56) References Cited

U.S. PATENT DOCUMENTS

| | | | |
|---|---|---|---|
| 8,460,984 B2 | 6/2013 | Wahl et al. | |
| 8,846,491 B1 | 9/2014 | Pham et al. | |
| 9,123,773 B1* | 9/2015 | Shen | |
| 9,171,752 B1* | 10/2015 | Wu | H01L 21/76224 |
| 9,190,328 B2 | 11/2015 | Basker et al. | |
| 9,362,181 B1* | 6/2016 | Xie | H01L 21/823878 |
| 9,412,616 B1* | 8/2016 | Xie | H01L 21/76224 |
| 2012/0280250 A1 | 11/2012 | Basker et al. | |
| 2015/0024561 A1* | 1/2015 | Li | H01L 21/28123 438/222 |

(Continued)

FOREIGN PATENT DOCUMENTS

CN         10347446 A         1/2016

OTHER PUBLICATIONS

Jagannathan, Hemanth et al., Method of Cutting Fins to Create Diffusion Breaks for FinFETs, Unpublished U.S. Appl. No. 14/964,445, filed Dec. 9, 2015 (12 pages plus 7 sheets formal drawings).

*Primary Examiner* — Jami M Valentine
(74) *Attorney, Agent, or Firm* — Daniel P. Morris; Otterstedt, Ellenbogen & Kammer, LLP (57) ABSTRACT

A method is provided for forming a fin cut that enables a single diffusion break in very dense CMOS structures formed using bulk semiconductor substrates. A dummy gate is removed from a finned structure to expose the top regions of the fins, the bottom fin regions being within a shallow trench isolation region. Selective vapor phase etching follows sequential ion implantation of the top and bottom fin regions to form a diffusion break cut region. The non-implanted regions of the substrate and the shallow trench isolation region remain substantially intact during each etching procedure. Double diffusion break cut regions are also enabled by the method.

20 Claims, 11 Drawing Sheets

(56) References Cited

U.S. PATENT DOCUMENTS

| | | | |
|---|---|---|---|
| 2015/0123211 A1* | 5/2015 | Zhang | H01L 27/0886 257/401 |
| 2015/0214119 A1 | 7/2015 | Basker et al. | |
| 2015/0255556 A1* | 9/2015 | Cheng | H01L 29/7813 257/332 |
| 2016/0013183 A1 | 1/2016 | Basker et al. | |
| 2016/0087062 A1* | 3/2016 | Yin | H01L 29/4916 257/344 |
| 2016/0087063 A1* | 3/2016 | Yin | H01L 29/4916 257/344 |
| 2016/0254180 A1* | 9/2016 | Liu | H01L 21/76229 |

* cited by examiner

FIN CUT ENABLING SINGLE DIFFUSION BREAKS

BACKGROUND

The present disclosure relates to the electrical, electronic, and computer arts, and, more particularly, to methods for cutting fins in the fabrication of integrated circuits comprising FinFETs.

Multi-gate field-effect transistors (FETs) are of considerable interest because of their superior electrostatic integrity, as well as their promise of lower supply voltages, reduced threshold voltages, and extended scalability. FinFETs are one form of such multi-gate device. In a FinFET, a narrow channel feature (i.e., fin) is raised above the substrate and passes under a gate, which effectively wraps around the fin. The gate is thereby capacitively coupled to the top as well as the sides of the fin. So structured, very little leakage current passes through channel portions of the fin when the device is in the off state. This allows the use of lower threshold voltages and higher switching speeds. Substrates used to form FinFETs include semiconductor on insulator (SOI) substrates and bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials.

A single fin may initially be patterned to span across regions that will ultimately be separated into multiple FinFETs. Later, after forming additional elements such as gates and contacts, the fin may be cut to isolate one transistor from another. Ideally, such cutting will utilize as small an area as possible. Nevertheless, cutting just the fins without simultaneously damaging the nearby structures remains challenging. Gas phase plasmas, for example, may be made somewhat selective to silicon, but have enough plasma potential to also etch nearby dielectric materials. When using bulk substrates in the fabrication of integrated circuits including FinFETs, the fins are cut relatively deeply to ensure a disconnecting fin cut.

Replacement metal gate (RMG) processes employed in "gate last" fabrication techniques may include depositing disposable gate level layers on a semiconductor substrate as blanket layers, i.e., as unpatterned contiguous layers. The disposable gate level layers can include, for example, a vertical stack of a disposable gate dielectric layer, a disposable gate material layer, and a disposable gate cap dielectric layer. The disposable gate level layer(s) can be removed selective to a planarization dielectric layer to be subsequently formed. The disposable gate level layers are lithographically patterned to form disposable gate structures.

Gate spacers can be formed on sidewalls of each of the disposable gate structures, for example, by deposition of a conformal dielectric material layer and an anisotropic etch. Ion implantations and/or epitaxial deposition processes can be employed to form source/drain regions for some devices. For example, dopants can be implanted into portions of the body regions that are not covered by the disposable gate structures and spacers.

A planarization dielectric layer is deposited over the semiconductor substrate, the disposable gate structures, and the gate spacers. The planarization dielectric layer may include a dielectric material that can be planarized, for example, by chemical mechanical planarization (CMP). For example, the planarization dielectric layer can include a doped silicate glass, an undoped silicate glass (silicon oxide), and/or porous or non-porous organosilicate glass. The planarization dielectric layer is planarized above the topmost surfaces of the disposable gate structures.

The disposable gate structures are removed by at least one etch. The removal of the disposable gate structures can be performed employing an etch chemistry that is selective to the gate spacers and to the dielectric materials of the planarization dielectric layer. Cavities are formed from the spaces remaining after the disposable gate structures are removed. The semiconductor surfaces above the channel regions of the substrate can be physically exposed at the bottoms of the gate cavities, though native oxide layers may be present. The gate cavities are laterally enclosed by the gate spacers that were formed on the sidewalls of the disposable structures. Replacement gate structures are ordinarily formed in the gate cavities. Replacement gate structures are formed by replacement of the disposable structures and overlie channel regions of the structures. A gate dielectric and a gate electrode are formed within each of the gate cavities.

SUMMARY

Embodiments of the present disclosure provide a means for cutting fins used to fabricate integrated circuits with FinFETs so as to isolate one transistor device from another. Advantageously, the cut may be accomplished in about the width of a gate, making the process extremely space-efficient.

A method is provided for forming a diffusion break in a finned semiconductor structure. The method includes obtaining a finned semiconductor structure including a bulk semiconductor substrate including a substrate portion, a plurality of parallel fins extending from the substrate portion, and a shallow trench isolation region. Each of the fins includes a top region extending above the shallow trench isolation region and a bottom region within the shallow trench isolation region. A plurality of parallel dummy gates extend over the fins and perpendicularly with respect to the fins. Spacers line the dummy gates. At least one of the dummy gates is removed to form a space between a pair of the spacers and above at least a first of the parallel fins. Ion implantation of the top region of the first fin causes the formation of a top amorphous alloy fin region which is removed using a chemical etch selective to the spacers, the shallow trench isolation region, and the substrate. Ion implantation of a portion of the bottom region of the first fin following removing the top amorphous alloy fin region causes the formation of a bottom amorphous alloy fin region. The bottom amorphous alloy fin region of the first fin is removed using a chemical etch selective to the spacers, the shallow trench isolation region, and the substrate to form a recess within the shallow trench isolation region, the space and the recess forming a diffusion break cut region.

Additional aspects of the disclosure are directed to a structure formed at least in part using a method like that set forth in the previous paragraph.

BRIEF DESCRIPTION OF THE DRAWINGS

These and other features, aspects, and advantages of the present invention will become better understood with regard to the following description, appended claims, and accompanying drawings where:

In the sectional views included herein, features present behind the sectional planes are not shown to reduce clutter and enhance clarity.

DETAILED DESCRIPTION

The subject matter of the instant application will be described with reference to illustrative embodiments. For this reason, numerous modifications can be made to these embodiments and the results will still come within the scope of the invention. No limitations with respect to the specific embodiments described herein are intended or should be inferred.

As the term is used herein and in the appended claims, "about" means within plus or minus twenty percent.

Figure 1:
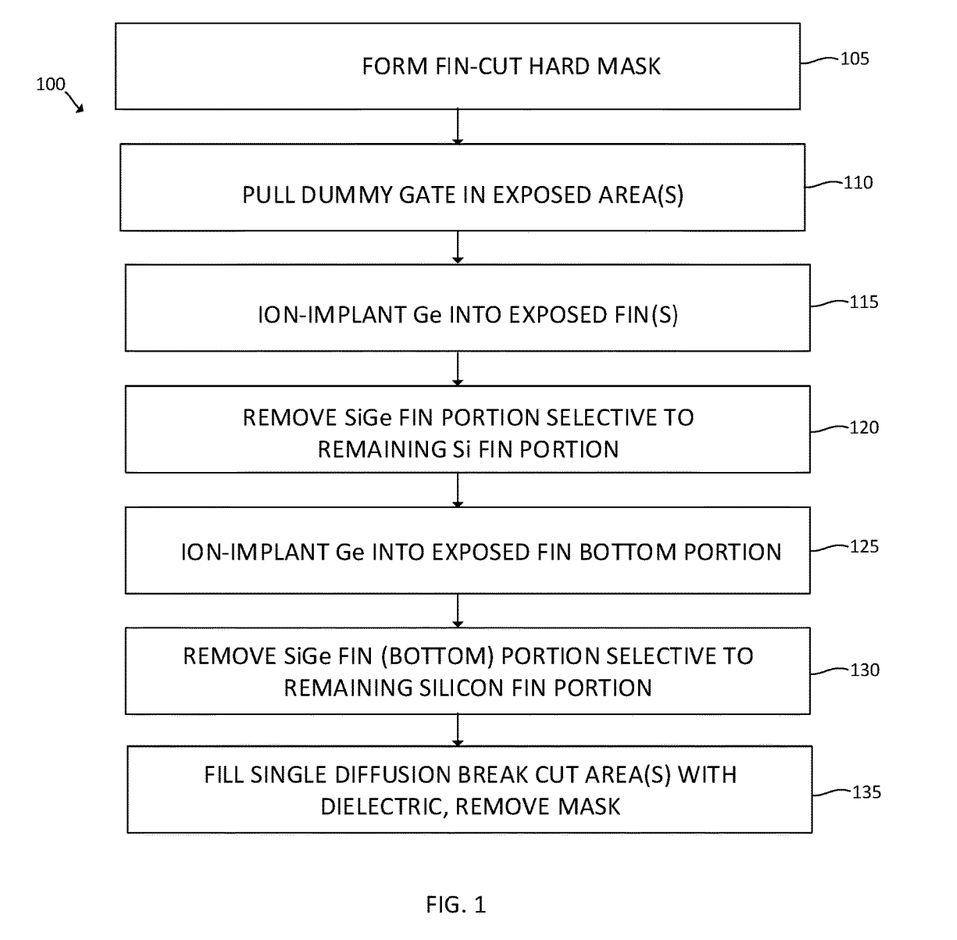
FIG. 1 shows a method for cutting a fin in accordance with an illustrative embodiment.

FIG. 1 shows a flow diagram of a method 100 for cutting a fin in accordance with an illustrative embodiment of the invention. The method is employed as part of a fabrication process in a dense bulk CMOS design. As will be further elucidated below, the cutting of the fin occurs in a region of a fin that sits immediately below a dummy gate (i.e., a gate feature not intended for use as an active device). FIGS. 3A-9B show sectional views of intermediate film stacks as the method 100 is completed. While the sectional and layout views relate to the formation of a single diffusion break, it will be appreciated that the method 100 can be applied to structures to be formed with a double diffusion break by processing two adjoining dummy gates that separate active regions rather than only a single dummy gate.

Although the method 100 and the structures formed thereby are entirely novel, many of the individual processing steps required to implement the method 100 may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, James D. Plummer et al., *Silicon VLSI Technology: Fundamentals, Practice, and Modeling* 1st Edition, Prentice Hall, 2001; S. Wolf and R. N. Tauber, *Silicon Processing for the VLSI Era, Volume* 1, Lattice Press, 1986; S. Wolf, *Silicon Processing for the VLSI Era, Vol. 4: Deep-Submicron Process Technology*, Lattice Press, 2003; and S. M. Sze, *VLSI Technology, Second Edition*, McGraw-Hill, 1988, all of which are incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However, one skilled in the art will readily recognize those processing steps omitted from this more generalized description. Structural and functional aspects of MOSFETs and FinFETs are described in J. G. Fossum et al., *Fundamentals of Ultra-Thin-Body MOSFETs and FinFETs*, Cambridge University Press, 2013, which is also hereby incorporated by reference herein.

Figure 3A:
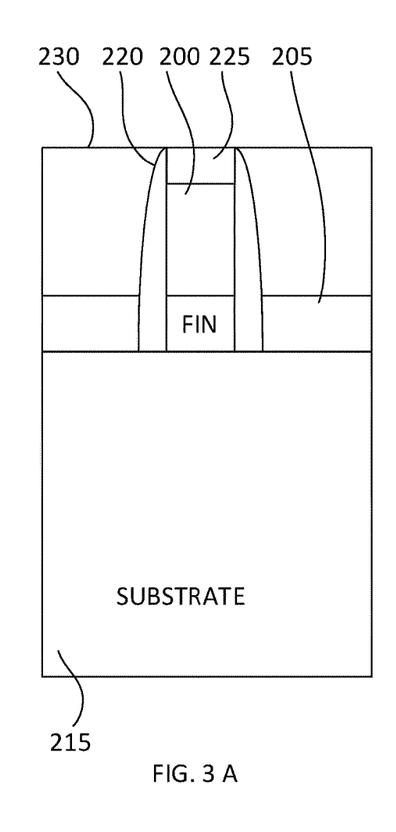
FIGS. 3A-3C show sectional views along planes within a fin, between and parallel to a fin, and perpendicular to the fins of an intermediate film stack that is formed while performing the FIG. 1 method.
Figure 3B:
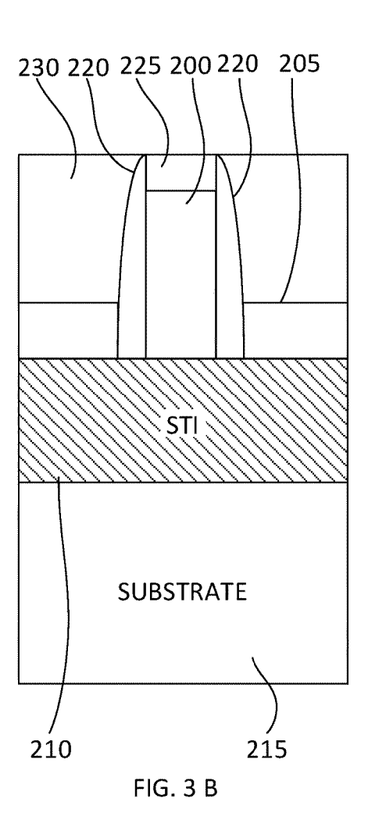
Figure 3C:
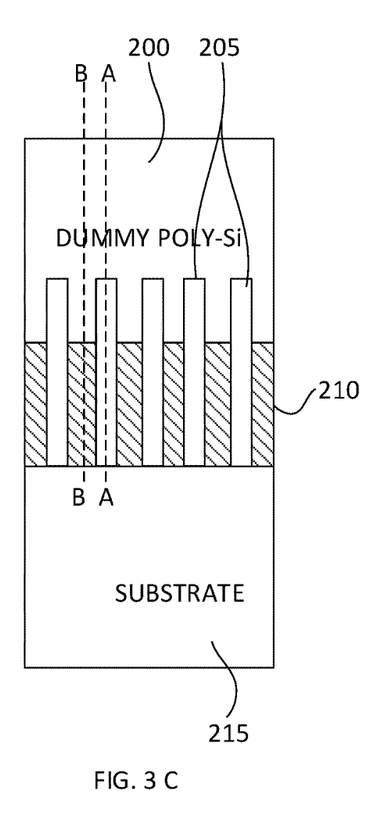

Before the method 100 is started, the assembly comprising the dummy gates 200, the fins 205 and the dielectric material forming the shallow trench isolation (STI) regions 210 between the fins 205 is already partially processed in a manner consistent with a gate-last or replacement metal gate (RMG) process flow. FIGS. 3A-3C show the state of an exemplary structure obtained at this point in the fabrication process. FIG. 3A is a schematic, cross-sectional view taken parallel to and within a fin to be cut, as designated by line A-A in FIG. 3C. FIG. 3B is another schematic, cross-sectional view taken along line B-B in FIG. 3C. Portions of a fin 205 outside the spacers 220 are shown in FIG. 3B and some of the subsequent figures that correspond to FIG. 3B, it being understood that the fin is not being shown in section in these figures but rather in the background to facilitate explanation of the processes discussed herein. The fins 205 extend from a bulk silicon substrate 215. While the fins 205 are shown as having completely vertical sidewalls in FIG. 3C, it will be appreciated that the fins may have tapered configurations that facilitate the introduction of STI-oxide material. The dummy gates 200 are formed over the fins 205 and, in so doing, respectively contact the fins 205 on three sides. Sidewall spacers 220 are formed on opposing sidewalls of the dummy gates 200. A cap 225 is disposed on the dummy gate 200 and within the sidewall spacers 220, and an interlayer dielectric (ILD) 230 is present on both sides of the dummy gate 200 and is planar with the top of the dummy gate 200.

In one or more non-limiting embodiments, the substrate 215 and the fins 205 may be formed of essentially undoped crystalline silicon, and the STI regions 210 and the ILD 230 may be formed of silicon dioxide. The fins 205 may be doped with boron or phosphorous to be p- or n-type. The dummy gates 200 may be formed of polysilicon, and the sidewall spacers 220 may be formed of lower-k dielectric materials, such as, siliconborocarbonitride (SiBCN), siliconoxycarbonitride (SiOCN), siliconoxycarbide (SiOC), or some combination thereof. The caps 225 may be formed of silicon nitride using conventional processes.

Figure 4A:
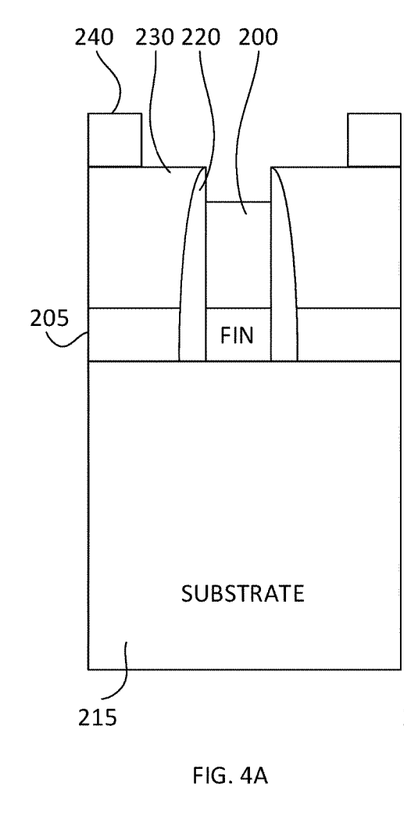
FIGS. 4A-4C show sectional views along planes within a fin, between and parallel to a fin, and perpendicular to the fins of an intermediate film stack that is formed subsequent to obtaining the film stack shown in FIGS. 3A-3C while performing the FIG. 1 method.
Figures 4B, 4C:
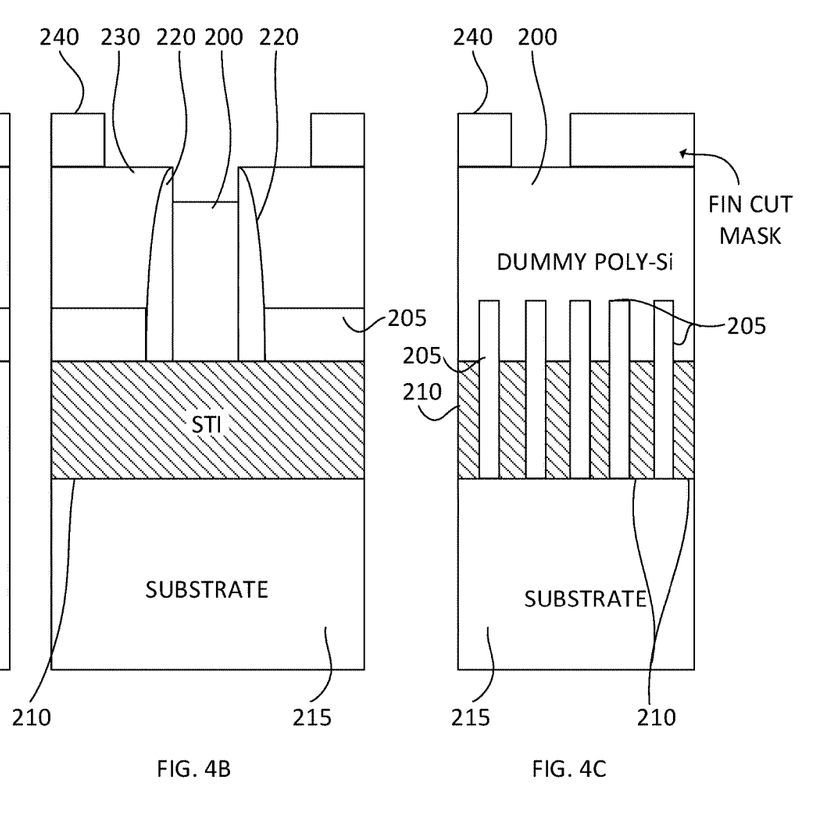

The method starts in step 105 with the application of a fin-cut hard mask 240 as shown in FIGS. 4A-4C. A purpose of the fin-cut hard mask 240 is to define which fins will be cut and which will remain intact. In the present illustrative embodiment, the fin-cut hard mask 240 is open over a selected dummy gate(s) 200. In contrast, the fin-cut hard mask 240 is intact over other dummy gates where a fin is not to be cut. In one or more embodiments, the fin-cut hard mask 240 may comprise silicon nitride, and may be formed by conventional deposition, photolithographic, and anisotropic etching steps. Deposition of the fin-cut hard mask 240 may be by chemical vapor deposition (CVD). A photoresist may then be patterned on top of the fin-cut hard mask 240 and its pattern transferred to the underlying material via reactive ion etching (ME). The photoresist may then be stripped by ashing or other suitable process. An over-etch also causes the removal of the nitride caps 225 shown in FIGS. 3A and 3B. The fin-cut hard mask 240, like one or more of the various structure elements described herein, is not drawn to scale and would be relatively thicker in practice.

Figure 5A:
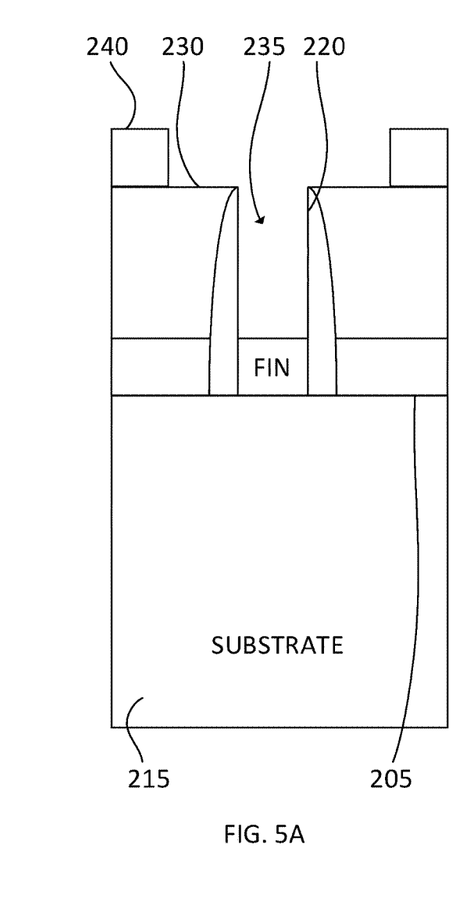
FIGS. 5A-5C show sectional views along planes within a fin, between and parallel to a fin, and perpendicular to the fins of an intermediate film stack that is formed subsequent to obtaining the film stack shown in FIGS. 4A-4C while performing the FIG. 1 method.
Figure 5B:
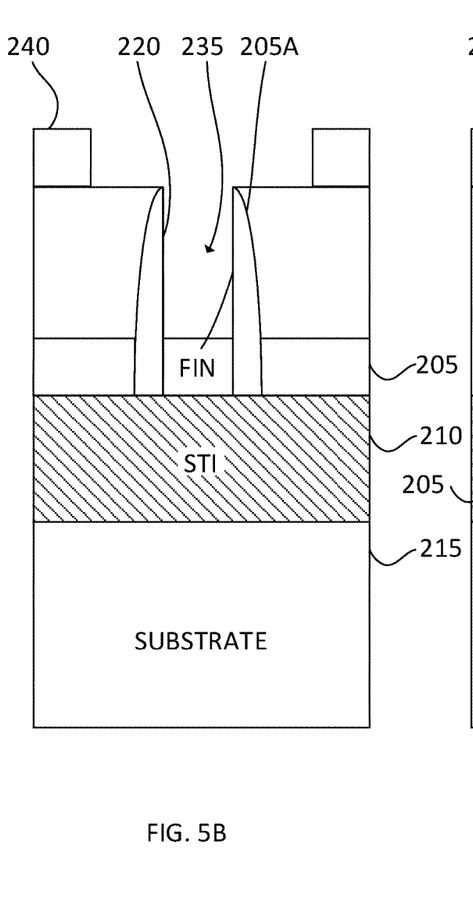
Figure 5C:
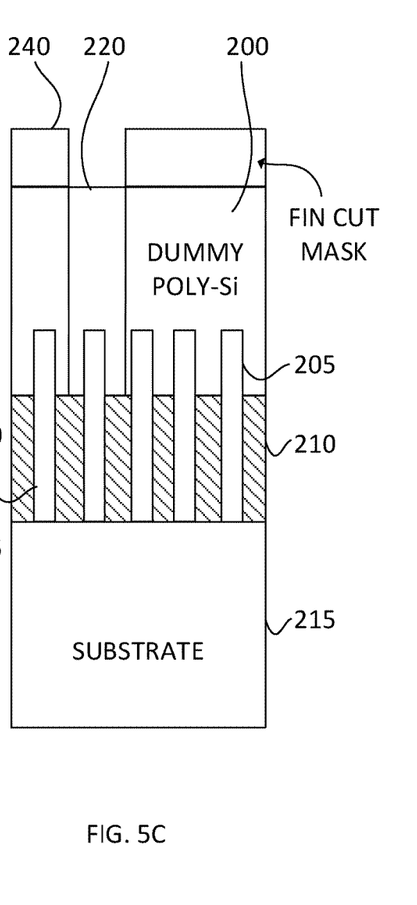

Following application of the fin-cut hard mask, removal of the polysilicon dummy gate 200 by, for example, wet etching in hot ammonia (selective to dielectrics) is conducted in step 110 to yield the film stack in FIGS. 5A-5C. While FIG. 5B is, like FIG. 3B, a sectional view taken between fins rather than through a fin, the top portion 205A of a fin is shown within the spacers 220 to facilitate discussion of the exemplary processes. The fin portions shown in FIG. 5B are not in section, but is instead in the background. Any oxide protecting the fins 205 from the polysilicon dummy gate material is also removed. Such processing leaves a space 235 over the fin 205. The space 235 is bordered on two sides by the sidewall spacers 220. At this point in the method 100, the top portion 205A of the fin 205 immediately below the space 235 and extending above the STI layer 210 is exposed. This is the portion of the fin 205 to be removed during a first etching process.

Figures 6A, 6B, 6C:
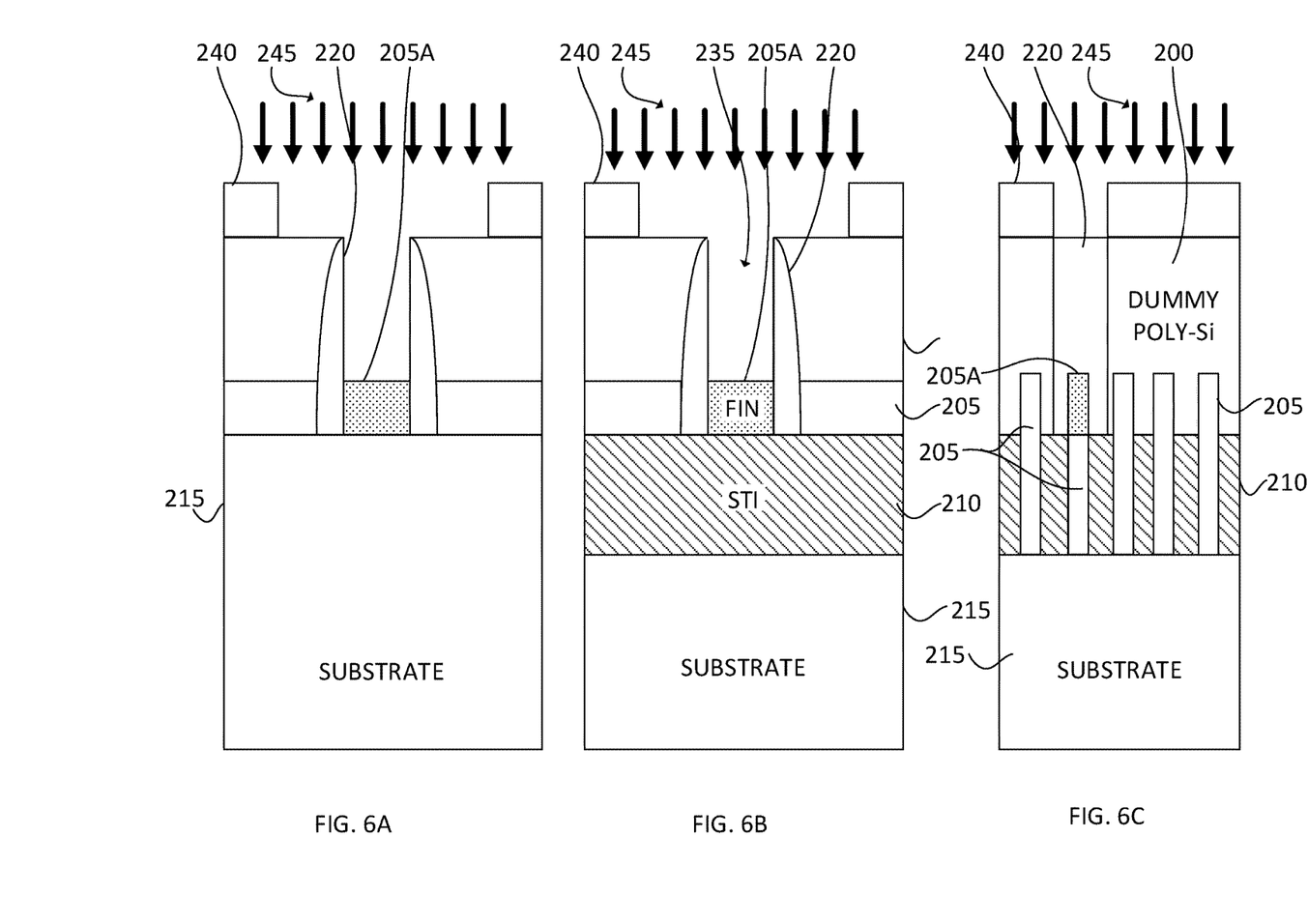
FIGS. 6A-6C show sectional views along planes within a fin, between and parallel to a fin, and perpendicular to the fins of an intermediate film stack that is formed subsequent to obtaining the film stack shown in FIGS. 5A-5C while performing the FIG. 1 method.

Step 115 of the method 100 involves the implantation of germanium ions 245 into the exposed portion 205A of the selected fin 205 to form an amorphous silicon germanium alloy. Ion implantation amorphizes the exposed portion 25A as well as increases the germanium content of the exposed portion of a silicon or silicon germanium fin 205. In some embodiments, the exposed portion has a germanium content exceeding twenty-five percent following ion implantation. The implant dose is such that a substantially amorphous silicon germanium fin portion having twenty to fifty percent germanium ($Si_{1-x}Ge_x$ where x is between 0.20 and 0.50) is formed, which allows selective etching with HCl gas. The implant energy is based in part on the fin height above the STI layer. Multiple energy implants may be conducted to provide uniform germanium content throughout the fin portion above the STI layer. As known in the art, ion implantation parameters such as dose and energy range are tailored based on the amount or depth of a substrate to be amorphisized. In some exemplary embodiments, fin widths are approximately eight nanometers (8 nm) and are amenable to angled implants that allow amorphization of the entireties of the fins portions above the STI layer. Ion implantation in this step 115 is limited substantially to the exposed fin portions, leaving most or all of the portions of the fins within the STI layer unaffected and therefore remaining crystalline. FIGS. 6A-6C schematically illustrate the resulting structure that includes a silicon germanium fin portion above the STI layer 210 and possibly slightly within the STI layer.

Figure 7A:
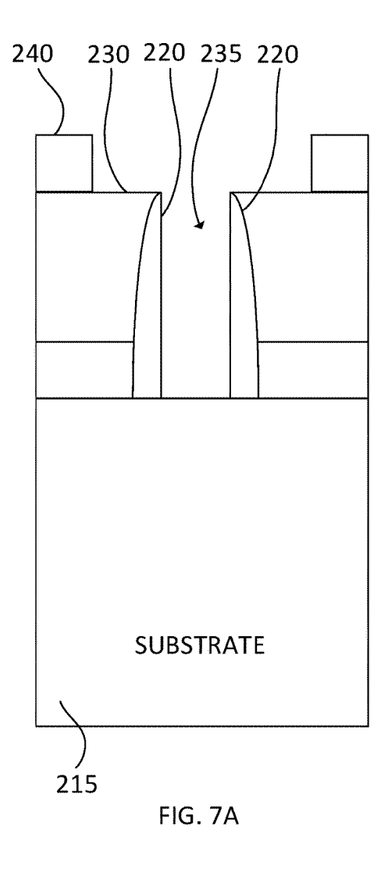
FIGS. 7A-7C show sectional views along planes within a fin, between and parallel to a fin, and perpendicular to the fins of an intermediate film stack that is formed subsequent to obtaining the film stack shown in FIGS. 6A-6C while performing the FIG. 1 method.
Figure 7B:
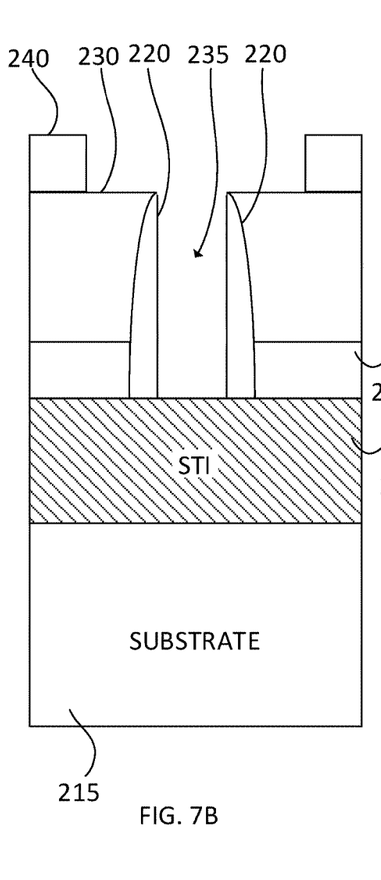
Figure 7C:
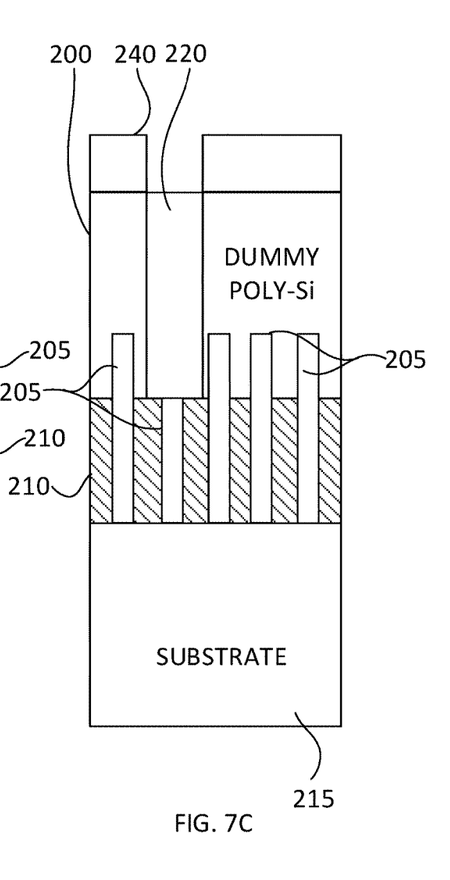

Once the implantation of germanium ions is completed, the relatively high-Ge content silicon germanium top portion of the fin 205 is selectively removed without significantly altering the bottom portion of the fin 205 (e.g., the non-amorphous silicon or low-Ge content silicon germanium fin portion beneath the ion-implanted portion), the STI layer 210 (e.g., silicon dioxide), the fin-cut hard mask (e.g., silicon nitride), and the sidewall spacers 220 (e.g., SiBCN, SiOCN, and/or SiOC). Silicon-germanium tends to be very susceptible to etching by hydrogen chloride. Therefore, in one or more embodiments, step 120 may utilize vapor phase etching (VPE) with hydrogen chloride to remove the modified fin portion. HCl VPE can be cojducted at pressures between ten and six hundred Torr and in a temperature range between five hundred and eight hundred (500-800) degrees Centigrade, though higher and lower temperatures may alternatively be suitable. The flow rate can be 100-200 sccm HCl, with 20 slm hydrogen as the carrier gas at 650° C. HCl gas phase etching of $Si_{1-x}Ge_x$ where x is between 0.20 and 0.50 is highly selective to silicon and low-Ge content silicon germanium and does not the attack dielectric materials within the film stack. Such a chemically selective fin cut relies on chemical interaction without resorting to a physical bombardment component characteristic of gas phase plasma. There is accordingly high selectivity with respect to dielectric materials that is difficult or impossible to achieve using conventional RIE techniques. A structure as schematically illustrated in FIGS. 7A-7C is obtained following the chemically selective etch.

Figure 8A:
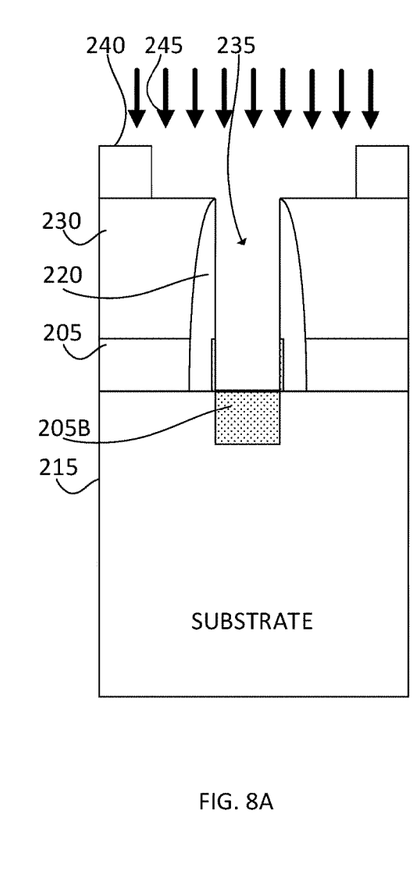
FIGS. 8A-8C show sectional views along planes within a fin, between and parallel to a fin, and perpendicular to the fin of an intermediate film stack that is formed subsequent to obtaining the film stack shown in FIGS. 7A-7C while performing the FIG. 1 method.
Figure 8B:
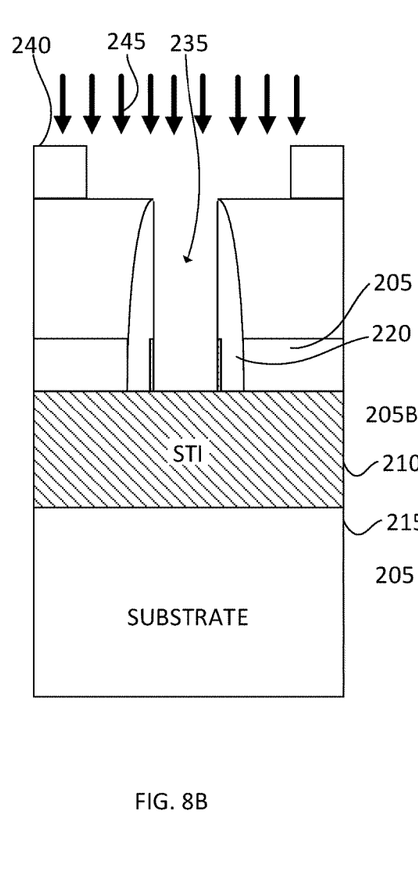
Figure 8C:
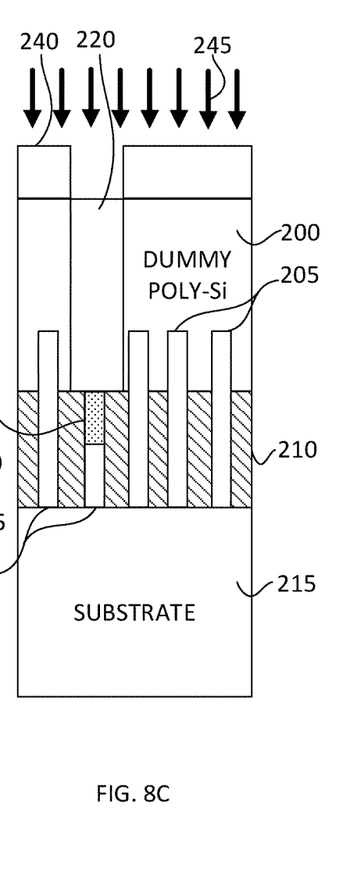

Integrated circuits including FinFETs formed from bulk substrates as disclosed herein require deep fin cutting to ensure a disconnecting fin cut. In contrast, fins formed from SOI substrates only require etching down to the buried oxide layer contained in such substrates. A second ion implantation step 125 is accordingly performed to amorphisize a portion 205B of the fin 205 within the STI layer 210 and form a silicon germanium alloy having a relatively high germanium content, for example $Si_{1-x}Ge_x$ where x is between 0.20 and 0.50. Ion implantation species scattering and reflection will also cause germanium ions to be partly implanted into the fin portions under the spacers 220. The implant under the spacers 220 happens inadvertently but can be enhanced by changing the implant angle during implantation. Implantation beneath the spacers is preferably limited to 2-3 nm, and may happen as a byproduct during the regular implantation process. Germanium-implanted fin regions are schematically illustrated in FIGS. 8A and 8B. As best shown in FIG. 8C, the germanium implantation does not extend to the top surface of the substrate layer 215, leaving a portion of the original fin within the STI layer 210 unaffected. Ion implantation depth within the STI layer is between twenty and fifty nanometers (20-50 nm) in some embodiments. The energy range employed for ion implantation may be higher than that employed in step 115 as deeper implantation is required in step 125 in one or more embodiments of the method. In an exemplary embodiment, a targeted germanium implant depth is 30-50 nm, the implant energy is 20-80 keV and the dosage is $5e^{15}$ to $5e^{16}/cm^2$, and more preferably the implant energy of germanium into silicon is 40-60 keV and the dosage between $1e^{16}$ and $5e^{16})/cm^2$.

Figure 9A:
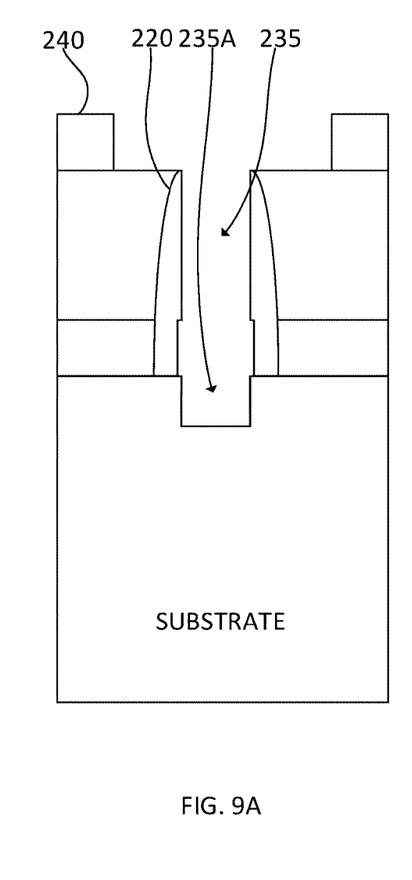
FIGS. 9A-9C show sectional views along planes within a fin, between and parallel to a fin, and perpendicular to the fins of an intermediate film stack that is formed subsequent to obtaining the film stack shown in FIGS. 8A-C while performing the FIG. 1 method.
Figure 9B:
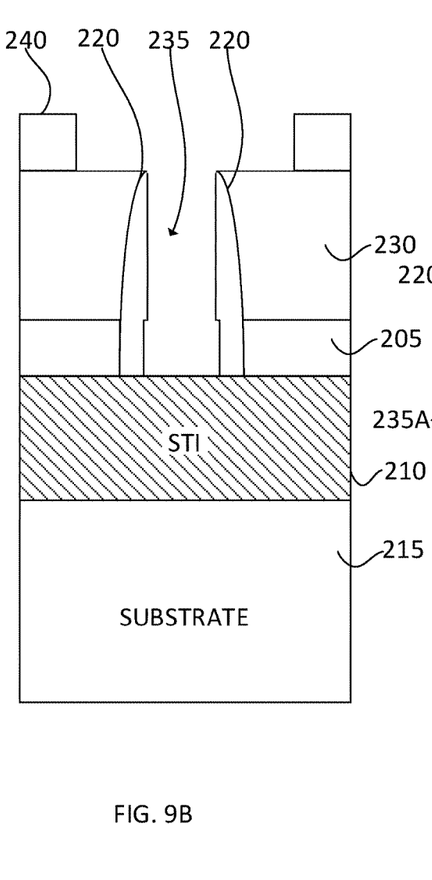
Figure 9C:
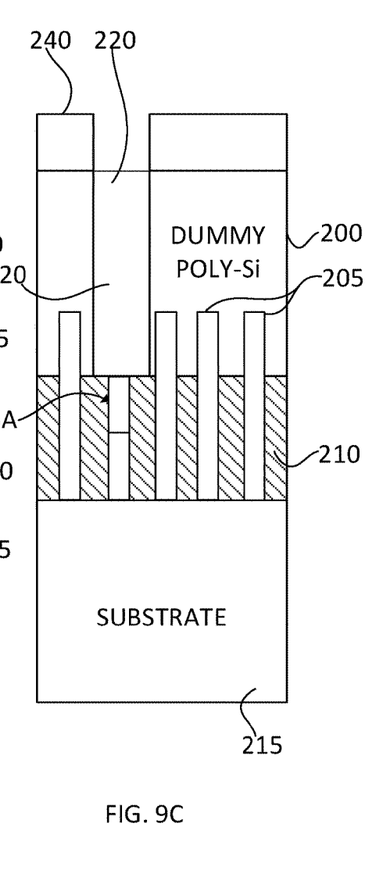

The germanium-implanted $Si_{1-x}Ge_x$ region 205B is removed by employing a chemically selective cut that is highly selective to silicon and that will leave the dielectric layers, including the spacers 220, essentially unaffected. Vapor phase etching (VPE) with hydrogen chloride can be employed in step 130 as well as in step 120 as described above. Such etching will also remove the ion-implanted regions of the spacers 220 and the ion-implanted regions beneath the spacers. FIGS. 9A-9C schematically illustrate a structure obtained following step 130. As shown in FIG. 9A, the spacers 220 include notched regions near the top surface of the STI layer. A recess 235A extends between the top of the remaining portion of the fin 205 and the space 235 between the spacers 220.

Figure 10A:
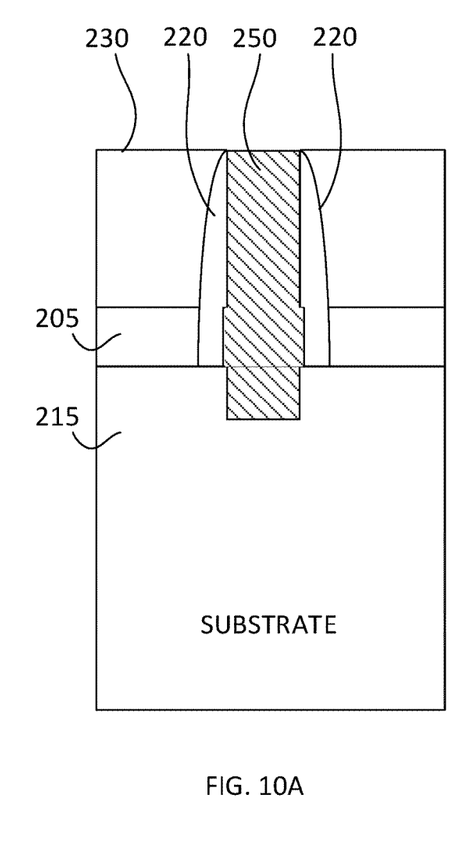
FIGS. 10A-10C show sectional views along planes within a fin, between and parallel to a fin, and perpendicular to the fins of an intermediate film stack that is formed subsequent to obtaining the film stack shown in FIGS. 9A-9C while performing the FIG. 1 method.
Figure 10B:
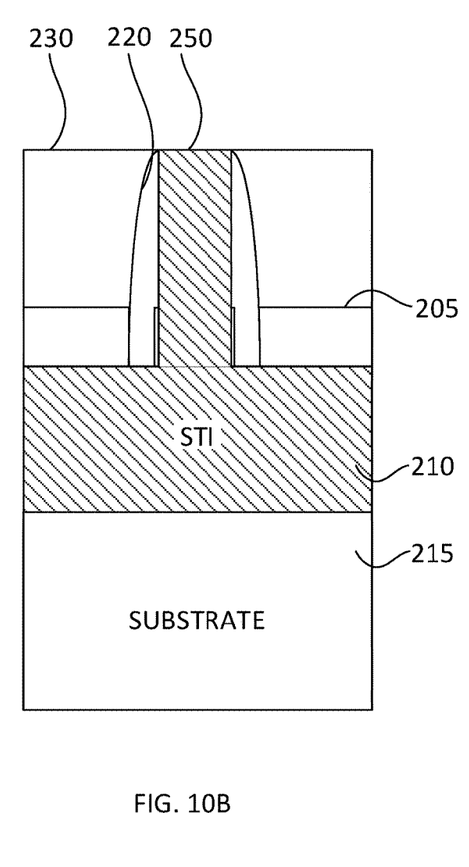
Figure 10C:
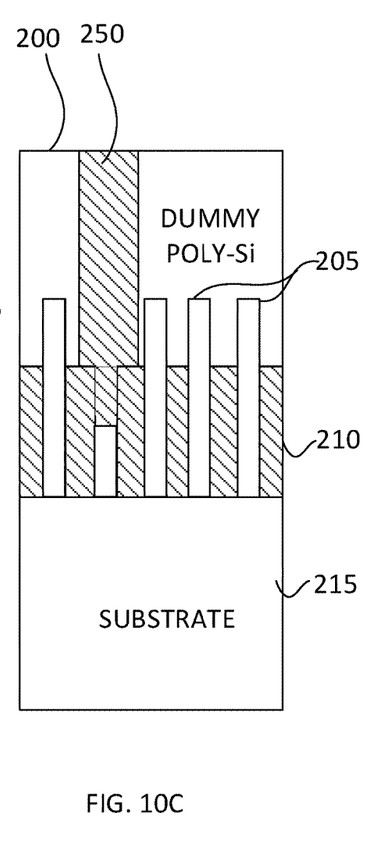

Finally, with the fin 205 now cut sufficiently to ensure electrical isolation of adjoining active regions, step 135 includes filling the space 235 and recess 235A left between the original sidewall spacers 220 and within the STI layer, respectively, with a dielectric material 250. The resultant film stack is shown in FIGS. 10A-10C. The dielectric material 250 may comprise silicon dioxide and may be formed by a conventional formation process, namely, a conformal deposition process (e.g., CVD) After formation, the dielectric material 250 acts to both electrically isolate the ends of the fins 205 as well as protect these fins 205 during subsequent processing.

Thus, the method 100 is operative to effectively cut a fin formed on a bulk semiconductor substrate within the confines of a single gate. So cut, what was once a single fin, now defines a first fin with a first terminus, and a second fin with a second terminus in spaced relation to the first terminus and in line with the first fin. The distance between the first terminus and the second terminus is about equal to the width of a dummy gate that originally occupied the space immediately above the cut fin.

Figure 2:
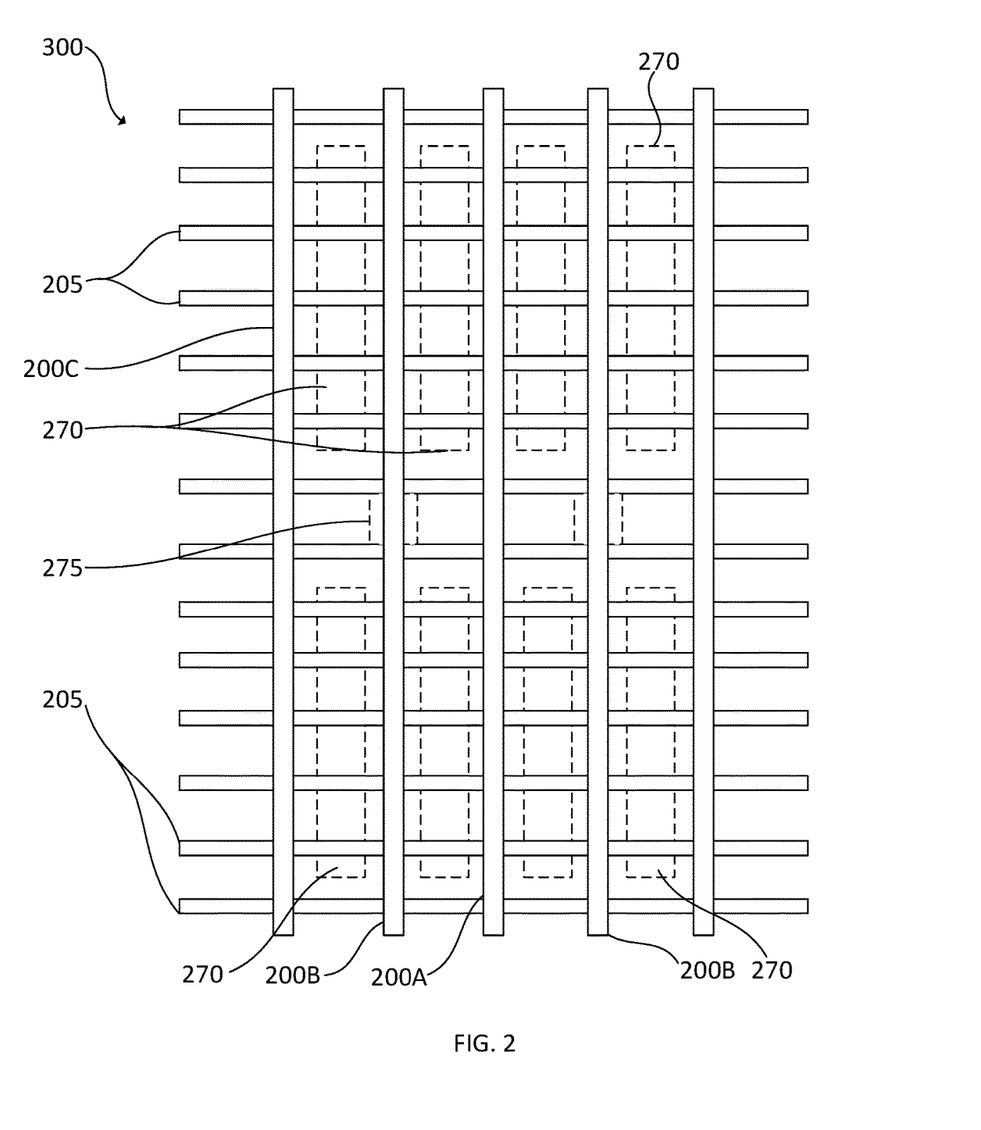
FIG. 2 is a schematic, layout view showing a portion of an integrated circuit formed on a finned substrate and including a single diffusion break.

The method 100 thereby becomes an excellent way to cut fins in a very selective manner in integrated circuits comprising FinFETs. FIG. 2 shows a layout view of an exemplary region 300 of a partially-formed integrated circuit. Fins 205 have been formed running left-to-right, and gate lines 200A, 200B, 200C have been formed up-down so that the gate lines cross over the fins. The region shown in FIG. 2 comprises two gate lines 200B that include active gate conductors following an RMG process to regulate two separate banks of FinFETs. A middle gate line 200A is disposed between the two banks of FinFETs and is used to form a single diffusion break using the method 100. Edge gate lines 200C are positioned at the edges of the banks and can be cut to electrically isolate the active regions 260 that contain the FinFETs. The method 100 may be utilized to cut the fins 205 under the middle and edge dummy gates corresponding to the schematically illustrated gate lines 200A, 200C. The fin-cut hard mask 240 as described above exposes the middle dummy gate corresponding to gate line 200A and about half of each of the edge dummy gates corresponding to gate lines 200C. With this fin-cut hard mask, practicing the method 100 has the effect of cutting the fins 205 immediately underneath the middle dummy gate. In this manner, opposing active regions 260 are electrically isolated from each other by the width of about a gate. At the same time, underneath the edge dummy gates corresponding to gate lines 200C, a film stack is produced in the edge regions wherein a terminus of each fin 205 is covered in a self-aligned sidewall spacer (not shown) that effectively isolates those portions of the fins 205 from subsequent processing steps. The sealing of the fin ends is similar to that disclosed in U.S. application Ser. No. 14/964,445 filed Dec. 9, 2015, which is incorporated by reference herein. FIG. 2 further schematically illustrates other elements formed or to be formed within the region. Such elements include trench silicide elements 270 that form contacts to the source/drain regions of the FinFETs and contacts 275 to the metal gate structures formed along the gate lines 200B during the RMG process.

The formation of a diffusion break in a fin in about the width of a dummy gate is extremely space-efficient. It should be compared to, for example, other designs wherein the entire region between two gates is utilized to create a diffusion break. The smaller area in accordance with methods set forth herein is due at least in part to the excellent selectivity that is achieved when etching portions of fins that have been converted to amorphous silicon-germanium.

Given the discussion thus far and with reference to the exemplary embodiments discussed above and the drawings, it will be appreciated that, in general terms, an exemplary fabrication method for forming a diffusion break in a finned semiconductor structure includes obtaining a finned semiconductor structure comprising a bulk semiconductor substrate including a substrate portion 215, a plurality of parallel fins 205 extending from the substrate portion, and a shallow trench isolation region 210. Each of the fins 205 includes a top region extending above the shallow trench isolation region and a bottom region within the shallow trench isolation region. A plurality of parallel dummy gates 200 extend over the fins and perpendicularly with respect to the fins. Spacers 220 line the dummy gates. At least one of the dummy gates is removed to form a space 235 between a pair of the spacers 220 and above at least a first of the parallel fins, as schematically illustrated in FIGS. 5A-5B. Ion implantation of the top region of the first fin causes the formation of a top amorphous alloy fin region 205A, as shown in FIGS. 6A-6C, which is removed using a chemical etch selective to the spacers 220, the shallow trench isolation region 210, and the substrate 215. Ion implantation of a portion of the bottom region of the first fin following removing the top amorphous alloy fin region causes the formation of a bottom amorphous alloy fin region 205B as schematically illustrated in FIGS. 8A and 8C. The bottom amorphous alloy fin region of the first fin is removed using a chemical etch selective to the spacers, the shallow trench isolation region, and the substrate to form a recess 235A within the shallow trench isolation region 215 as schematically illustrated in FIGS. 9A and 9C. The space 235 and the recess 235A form a diffusion break cut region. Amorphous alloys such as silicon germanium alloys having the formula $Si_{1-x}Ge_x$ where x is at least 0.2 facilitate selective etching. Dielectric material is deposited within the diffusion break cut region as schematically illustrated in FIGS. 10A-10C.

Figure 11:
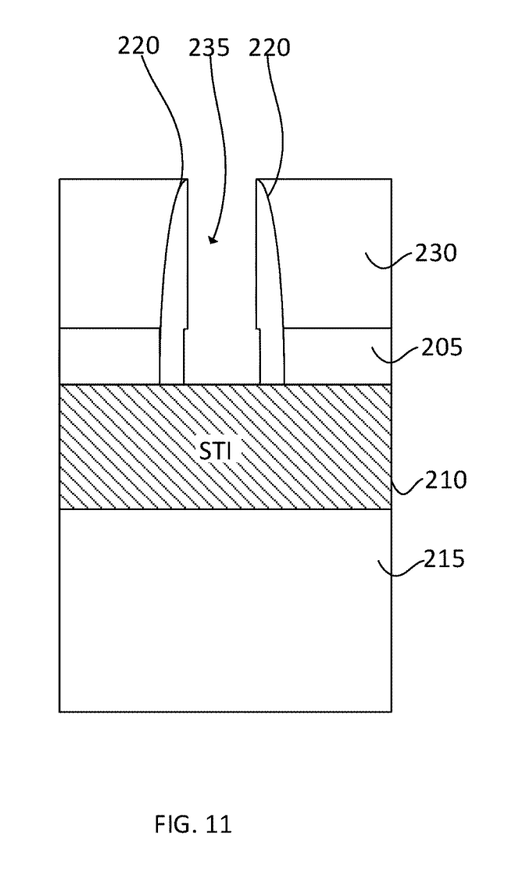
FIG. 11 is a sectional view showing a recess within the intermediate film stack for facilitating formation of a gate structure.

Portions of the dielectric layer 250 are recessed to facilitate electrical gate formation. FIG. 11 is a sectional view that schematically illustrates a portion of the exemplary film stack following removal of the selected portions of the dielectric layer 250 and prior to gate stack formation.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices, and a central processor. These integrated circuits and end products would also fall within the scope of the disclosed subject matter.

The above-described embodiments of the invention are intended to be illustrative only. Other embodiments may, for example, utilize different materials and processing steps from those expressly set forth above to achieve embodiments falling within the scope of the invention. These many alternative embodiments will be apparent to one having ordinary skill in the relevant arts. In other embodiments, for example, a FinFET may be formed with III-V materials that allow a portion of a fin to be etched away with high selectivity to the surrounding structures.

All the features disclosed herein may be replaced by alternative features serving the same, equivalent, or similar purposes, unless expressly stated otherwise. Thus, unless expressly stated otherwise, each feature disclosed is one example only of a generic series of equivale The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Any element in a claim that does not explicitly state "means for" performing a specified function or "step for" performing a specified function is not to be interpreted as a "means for" or "step for" clause as specified in AIA 35 U.S.C. §112(f). In particular, the use of "steps of" in the claims herein is not intended to invoke the provisions of AIA 35 U.S.C. §112(f).

What is claimed is:

1. A method for forming a diffusion break in a finned semiconductor structure, comprising:
    obtaining a finned semiconductor structure including a bulk semiconductor substrate including a substrate portion, a plurality of parallel fins extending from the substrate portion, a shallow trench isolation region, each of the fins including a top region extending above the shallow trench isolation region and a bottom region within the shallow trench isolation region, a plurality of parallel dummy gates extending over the fins and perpendicularly with respect to the fins, and spacers lining the dummy gates;
    removing at least one of the dummy gates to form a space between a pair of the spacers and above at least a first of the parallel fins;
    ion implanting the top region of the first fin to cause the formation of a top amorphous alloy fin region;
    removing the top amorphous alloy fin region of the first fin using a chemical etch selective to the spacers, the shallow trench isolation region, and the substrate;
    ion implanting a portion of the bottom region of the first fin following removing the top amorphous alloy fin region to cause the formation of a bottom amorphous alloy fin region, and
    removing the bottom amorphous alloy fin region of the first fin using a chemical etch selective to the spacers, the shallow trench isolation region, and the substrate to form a recess within the shallow trench isolation region, the space and the recess forming a diffusion break cut region.

2. The method of claim 1, wherein the bulk semiconductor substrate comprises silicon, ion implanting the top and bottom regions of the first fin further includes implanting germanium in the top and bottom regions of the first fin, the top amorphous alloy fin region comprising silicon germanium, and the bottom amorphous alloy fin region comprising silicon germanium.

3. The method of claim 2, wherein the top and bottom amorphous alloy fin regions consist essentially of $Si_{1-x}Ge_x$ where x is at least 0.20.

4. The method of claim 3, wherein removing the top amorphous alloy fin region and the bottom amorphous alloy fin region comprises vapor phase etching.

5. The method of claim 4, wherein the vapor phase etching utilizes hydrogen chloride.

6. The method of claim 5, further including replacing one or more of the dummy gates with metal gates.

7. The method of claim 6, wherein the bulk semiconductor substrate consists essentially of monocrystalline silicon.

8. The method of claim 7, wherein the fins consist essentially of silicon or silicon germanium.

9. The method of claim 8, wherein the dummy gates comprise polysilicon.

10. The method of claim 8, further including forming first and second FinFETs electrically isolated by the diffusion break cut region.

11. The method of claim 2, wherein:
    removing the at least one of the dummy gates forms the space above a plurality of the parallel fins,
    ion implanting the top region of the first fin further includes implanting top regions of the plurality of the parallel fins to form top amorphous alloy fin regions within the plurality of the parallel fins;

removing the top amorphous alloy fin region of the first fin further includes removing the top amorphous alloy fin regions within the plurality of the parallel fins;

ion implanting the portion of the bottom region of the first fin further includes ion implanting portions of the bottom regions of the plurality of the parallel fins, thereby forming bottom amorphous alloy fin regions within the plurality of the parallel fins, and removing the bottom amorphous alloy fin region of the first fin further includes removing the bottom amorphous alloy fin regions within the plurality of the parallel fins.

12. The method of claim 11, wherein ion implanting the top and bottom regions of the first fin and ion implanting portions of the bottom regions of the plurality of fins further includes implanting germanium such that the top and bottom amorphous alloy fin regions consist essentially of $Si_{1-x}Ge_x$ where x is at least 0.20.

13. The method of claim 12, wherein removing the top and bottom amorphous alloy fin regions comprises vapor phase etching.

14. The method of claim 13, wherein the vapor phase etching utilizes hydrogen chloride.

15. The method of claim of claim 14, further including depositing an oxide material within the space and recess.

16. The method of claim 14, wherein removing the bottom amorphous alloy fin regions within the plurality of parallel fins further includes leaving a portion of each fin extending above the substrate portion and within the shallow trench isolation region.

17. The method of claim 16, further including depositing dielectric material within the diffusion break cut region.

18. The method of claim 1, further including depositing dielectric material within the diffusion break cut region.

19. The method of claim 18, wherein the bulk semiconductor substrate comprises silicon, and ion implanting the top and bottom regions of the first fin further includes implanting germanium in the top and bottom regions of the first fin such that the top and bottom amorphous alloy fin regions consist essentially of $Si_{1-x}Ge_x$ where x is at least 0.20.

20. The method of claim 19, wherein removing the top and bottom amorphous alloy fin regions comprises vapor phase etching utilizing hydrogen chloride.

* * * * *